(12) United States Patent
Mills et al.

(10) Patent No.: US 9,444,230 B2
(45) Date of Patent: Sep. 13, 2016

(54) POWER DISTRIBUTION ASSEMBLY AND HEADER ASSEMBLY THEREFOR

(71) Applicant: Labinal, LLC, Denton, TX (US)

(72) Inventors: Patrick Wellington Mills, Bradenton, FL (US); James Michael McCormick, Bradenton, FL (US)

(73) Assignee: LABINAL, LLC, Denton, TX (US)

( * ) Notice: Subject to any disclaimer, the term of this patent is extended or adjusted under 35 U.S.C. 154(b) by 35 days.

(21) Appl. No.: 14/532,556

(22) Filed: Nov. 4, 2014

(65) Prior Publication Data

US 2015/0124380 A1    May 7, 2015

Related U.S. Application Data

(60) Provisional application No. 61/899,371, filed on Nov. 4, 2013.

(51) Int. Cl.

| | |
|---|---|
| *H05K 7/14* | (2006.01) |
| *H02B 1/044* | (2006.01) |
| *H02B 1/20* | (2006.01) |
| *H02B 1/56* | (2006.01) |
| *H05K 7/20* | (2006.01) |
| *H02G 5/10* | (2006.01) |

(52) U.S. Cl.
CPC ............... *H02B 1/044* (2013.01); *H02B 1/20* (2013.01); *H02B 1/56* (2013.01); *H05K 7/1457* (2013.01); *H05K 7/2039* (2013.01); *H02G 5/10* (2013.01)

(58) Field of Classification Search
CPC .......... H02B 1/044; H02B 1/20; H02B 1/56; H01H 9/52; H05K 7/1457; H05K 7/2039; H02G 5/10

USPC ................................ 361/600–678, 722, 723
See application file for complete search history.

(56) References Cited

U.S. PATENT DOCUMENTS

| 7,099,155 | B2* | 8/2006 | Kobayashi | .......... B60R 16/0238 165/80.3 |
|---|---|---|---|---|
| 7,837,496 | B1 | 11/2010 | Pal | |
| 2005/0099778 | A1* | 5/2005 | Nakanishi | ............ H05K 3/0061 361/704 |
| 2011/0235244 | A1* | 9/2011 | Mills | ...................... H02B 1/056 361/656 |
| 2012/0152706 | A1 | 6/2012 | Mills | |

FOREIGN PATENT DOCUMENTS

| WO | 2012/166379 | 12/2012 |
|---|---|---|
| WO | 2013/003345 | 1/2013 |

OTHER PUBLICATIONS

International Search Report filed in PCT/US2014/063854 mailed Feb. 12, 2015.

* cited by examiner

*Primary Examiner* — Zachary M Pape
(74) *Attorney, Agent, or Firm* — Rankin, Hill & Clark LLP

(57) ABSTRACT

A header assembly for a power distribution assembly in which the power distribution assembly includes a mounting portion and a plurality of current carrying components. The header assembly includes a first header segment made from a first material and a second header segment disposed on the first header segment and being made from a second different material. The first header segment and the second header segment together form a composite header assembly structured to be mechanically coupled to the mounting portion and electrically connected to at least some of the current carrying components. At least one of the first material and the second material is thermally conductive and electrically insulative.

14 Claims, 3 Drawing Sheets

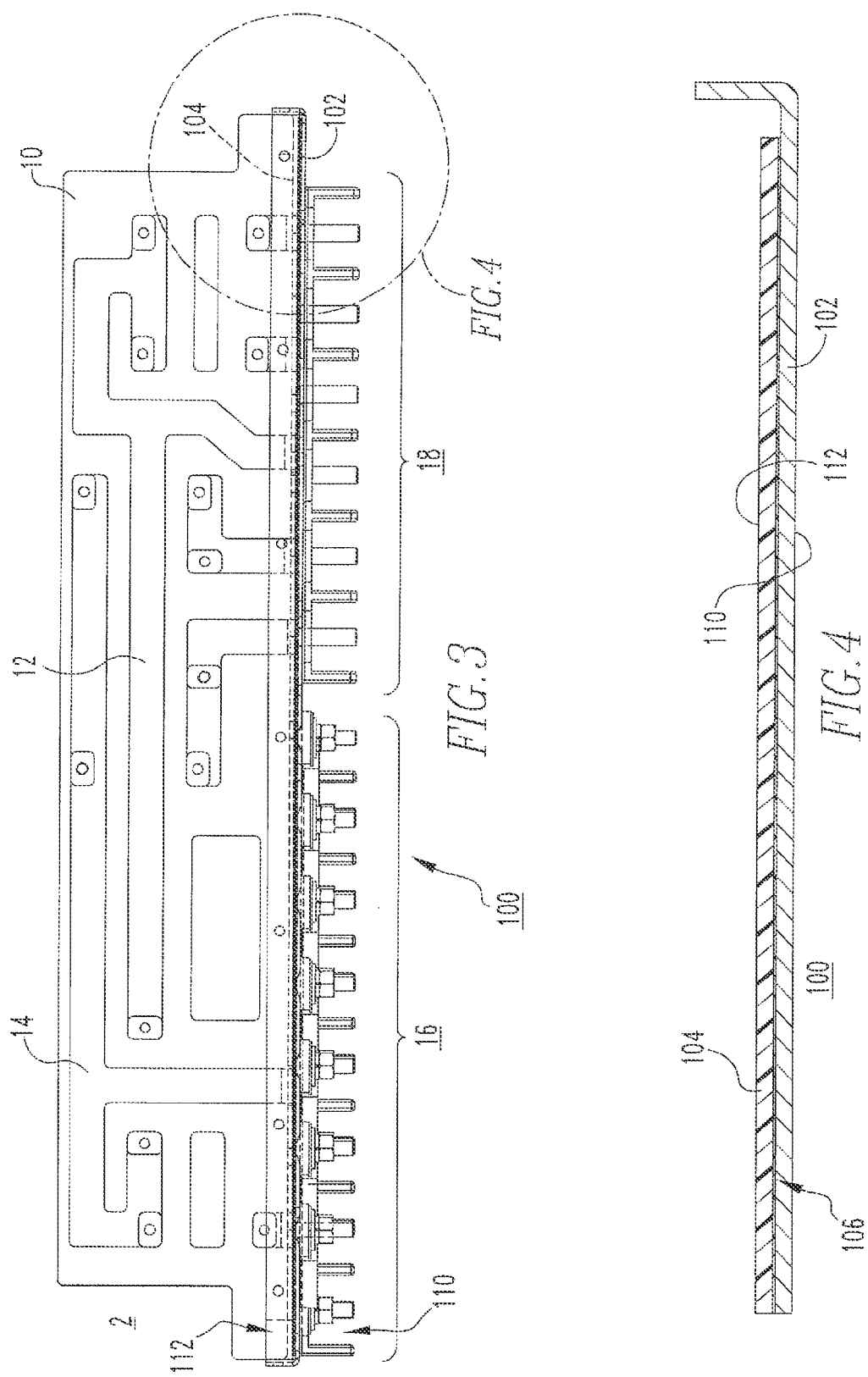

POWER DISTRIBUTION ASSEMBLY AND HEADER ASSEMBLY THEREFOR

BACKGROUND

1. Field

The disclosed concept relates generally to power distribution assemblies and, more particularly, to power distribution assemblies, such as for example, aerospace power distribution assemblies. The disclosed concept also relates to header assemblies for power distribution assemblies.

2. Background Information

Aircraft or aerospace electrical systems generate, regulate and/or distribute power throughout an aircraft.

Aerospace power distribution assemblies, for example, generally include a housing or enclosure, a number of input and output connectors, internal electrical bussing, electrical conductors, a number of electrical switching apparatus, such as contactors, circuit breakers, relays and the like and/or fuses. More specifically, in aircraft or aerospace electrical systems relatively small circuit breakers, commonly referred to as subminiature or aircraft circuit breakers, are often used to protect electrical circuitry from damage due to an overcurrent condition, such as an overload condition or a relatively high level short circuit or fault condition. Aircraft circuit breakers also often serve as switches for turning equipment on and off, and are grouped together as part of a circuit protection module with the circuit breakers/switches being accessible on an outer panel of the enclosure, within the aircraft.

It is necessary to separate and isolate the electrical components to provide sufficient electrical insulation between conductors. This is particularly true where the power distribution has relatively high current power input and outputs. In addition, significant heat can be generated in aircraft electrical systems, which among other issues increases resistivity and adversely affects system performance.

There is room, therefore, for improvement in power distribution assemblies, and in header assemblies therefor.

SUMMARY

According to one aspect, a header assembly for a power distribution assembly in which the power distribution assembly includes a mounting portion and a plurality of current carrying components. The header assembly includes a first header segment made from a first material and a second header segment disposed on the first header segment and being made from a second different material. The first header segment and the second header segment together form a composite header assembly structured to be mechanically coupled to the mounting portion and electrically connected to at least some of the current carrying components. At least one of the first material and the second material is thermally conductive and electrically insulative.

According to another aspect, a power distribution assembly includes a housing, a mounting portion coupled to the housing, a plurality of current carrying components, and a composite header assembly coupled to the mounting portion. The composite header assembly includes a first header segment made from a first material, and a second header segment disposed on the first header segment and being made from a second different material. The composite header assembly is electrically connected to at least some of the current carrying components. Further, at least one of the first material and the second material is thermally conductive and electrically insulative to electrically insulate the at least some of the current carrying components and to manage heat within the power distribution assembly.

BRIEF DESCRIPTION OF THE DRAWINGS

A full understanding of the disclosed concept can be gained from the following description of the preferred embodiments when read in conjunction with the accompanying drawings in which:

FIG. 3 is a top plan view of the power distribution assembly and header assembly of FIG. 2 with certain electrical apparatus removed for ease of illustration; and FIG. 4 is an enlarged section view of a portion of the header assembly of FIG. 3.

DESCRIPTION OF THE PREFERRED EMBODIMENTS

Figure 1:
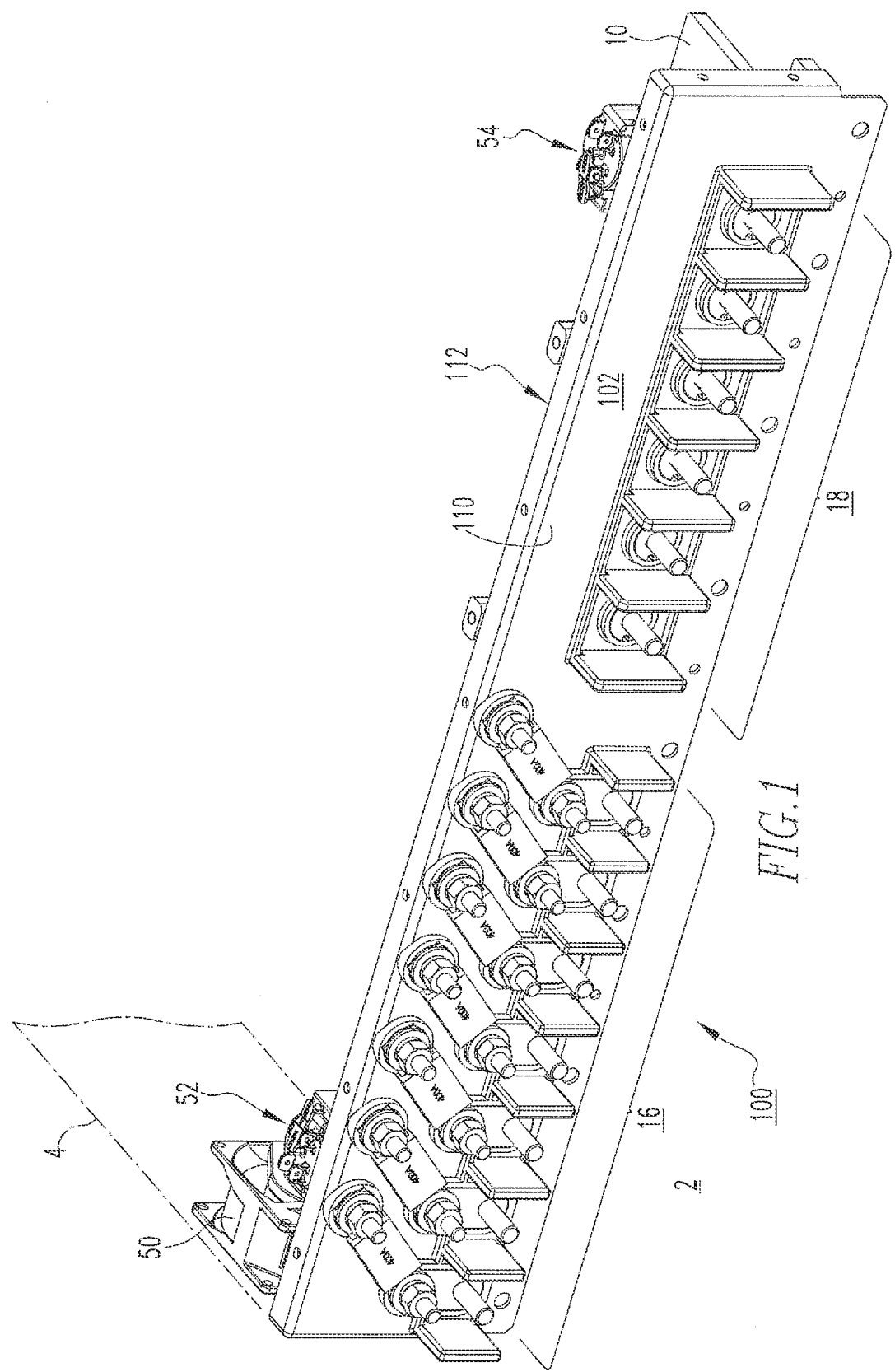
FIG. 1 is a front isometric view of a portion of a power distribution assembly and header assembly therefor, in accordance with an embodiment of the disclosed concept.

For purposes of illustration, the disclosed concept is described herein in association with aircraft or aerospace power distribution assemblies and systems employing subminiature or aircraft circuit breakers and other electrical apparatus (e.g., without limitation, relays; contactors), although it will become apparent that the disclosed concept is applicable to a wide range of different applications. For example and without limitation, it will become evident that the disclosed concept is applicable to other types of electrical systems including, for example and without limitation, circuit breaker panels or circuit protection modules used in AC systems operating at other frequencies; to larger circuit breakers, such as miniature residential or commercial circuit breakers; and to a wide range of circuit breaker applications, such as, for example and without limitation, residential, commercial, industrial, aerospace, and automotive.

As employed herein, the term "current carrying component" refers to an electrical conductor (e.g., solid; stranded; insulated; non-insulated), an electrical bus member (e.g., bus bar), a pin, a connector, a copper conductor, an aluminum conductor, a suitable metal conductor, or other suitable material or component that permits an electric current to flow easily.

As employed herein, the term "embedded" shall mean disposed within a material so as to be integrally formed within, surrounded by, or covered by the material. Accordingly, unless explicitly stated otherwise, an electrical conductor that is "at least partially embedded" in accordance with the disclosed concept may be either entirely embedded (e.g., integrally formed within; surrounded by; covered by) within the material, or a portion of the electrical conductor may protrude outwardly from the material.

As employed herein, the term "liquid crystalline polymer" shall mean a moldable (e.g., without limitation, by injection molding) material that is both thermally conductive and electrically non-conductive (e.g., an electrical insulator) exhibiting dielectric properties and expressly includes, but is not limited to, CoolPoly®, which is available from Cool Polymers, Inc. having a place of business at 51 Circuit Drive, North Kingstown, R.I. 02852.

As employed herein, the phrase "thermally conductive and electrically insulative adhesive" shall mean a suitable bonding material (e.g., single-sided; double-sided), mechanism or agent that is both thermally conductive and electrically non-conductive (e.g., an electrical insulator) exhibiting dielectric properties and expressly includes, but is not limited to, Ryton®, which is available from Chevron Phillips Chemical Company LLC having a place of business at P.O. Box 4910 The Woodlands, Tex. 77387-4910.

As employed herein, the term "managed" or "manages" shall mean handled or directed with a degree of skill, worked upon or tired to alter for a purpose, or succeeded in accomplishing or achieved a purpose.

As employed herein, the statement that two or more parts are "coupled" together shall mean that the parts are joined together either directly or joined through one or more intermediate parts.

As employed herein, the statement that two or more parts are "attached" or "directly connected" shall mean that the parts are joined together directly, without any intermediate parts.

As employed herein, the term "number" shall mean one or an integer greater than one (i.e., a plurality).

Figure 2:
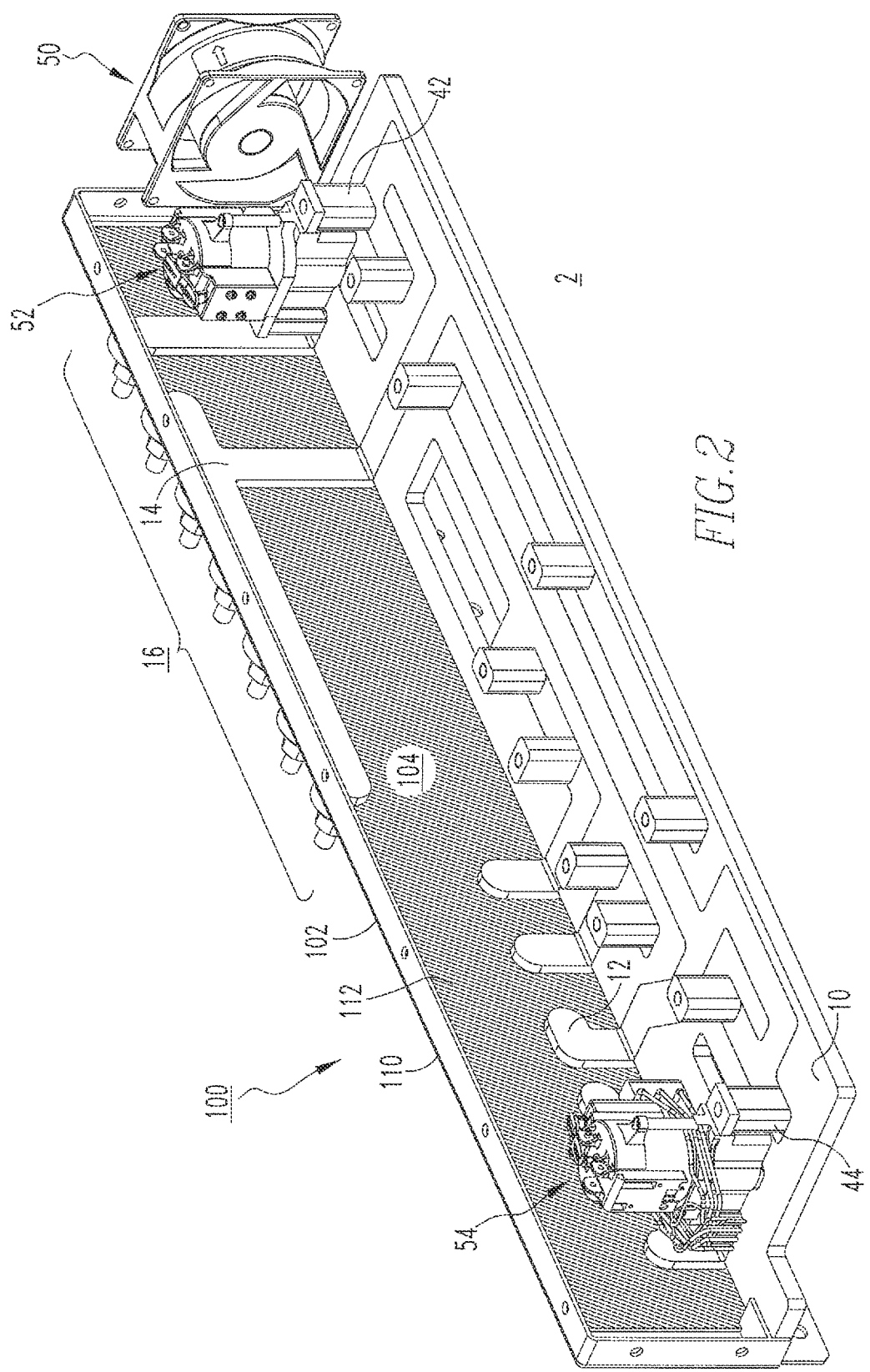
FIG. 2 is a back isometric view of the portion of the power distribution assembly and header assembly therefor of FIG. 1.

Referring now to the drawings, which are not intended to limit the scope of the disclosed concept, FIG. 1 shows a portion of a header assembly 100 for a power distribution assembly 2 (partially shown). The power distribution assembly 2 (e.g., without limitation, a power distribution unit (PDU) for an aircraft) generally includes an enclosure 4 (partially shown in simplified form in FIG. 1), a mounting portion 10 (best shown in FIG. 2), and a plurality of current carrying components such as, for example and without limitation, bus bars see, e.g., without limitation, bus bars 12 and 14, shown in FIGS. 2 and 3), and power inputs 16 (FIGS. 1-3) and outputs 18 (FIGS. 1 and 3). The example power distribution assembly 2 further includes a number of electrical apparatus, such as for example and without limitation, the fan 50, and electric motors 52 and 54, which are respectively mounted on mounts 42 and 44 of mounting portion 10, as best shown in FIG. 2. It will be appreciated, however, that the power distribution assembly 2 could have any known or suitable alternative number, type and/or configuration (not shown) of current carrying components and/or electrical apparatus, without departing from the scope of the disclosed concept.

As best shown in FIG. 2 and in the enlarged section view of FIG. 4, the header assembly 100 includes a first header segment 102 made from a first material, and a second header segment 104 disposed on the first header segment 102 and being made from a second different material from the first material. Thus, the first and second header segments 102,104 together form a composite header assembly 100. The composite header assembly 100 is structured to be mechanically coupled to the mounting portion 10, and to be electrically connected to at least some of the aforementioned current carrying components (e.g., without limitation, bus bars 12,14; power inputs 16; power outputs 18). At least one of the first material and the second material is thermally conductive and electrically insulative. Accordingly, the composite header assembly 100 functions to both electrically insulate the current carrying components and to manage heat within the power distribution assembly 2. This is particularly important where the power distribution assembly 2 may have relatively high current input and outputs and/or where it is relatively small and relatively lightweight.

More specifically, that the composite header assembly 100 preferably includes a relatively high strength first header segment 102 made from a suitable material such as, for example and without limitation, aluminum or thermoplastic, which acts as a mounting spine with the desired material properties of sufficient strength, arcing and impact resistance, and thermal stability. The second header segment 104 is preferably made from a thermally conductive and electrically insulative material such as, for example and without limitation, a liquid crystalline polymer, in order to provide additional heat transfer benefits while also offering necessary electrical isolation, for example, between mutual power inputs (see, e.g., without limitation, inputs 16) and power outputs (see, e.g., without limitation, outputs 18). Among other benefits, the disclosed composite header assembly 100 reduces the overall component count of the power distribution assembly 2, thereby significantly reducing the associated complexity and cost, as well as advantageously reducing the overall weight and size of the assembly.

In accordance with one non-limiting example embodiment, which is shown in the enlarged section view of FIG. 4, the composite header assembly further includes an adhesive 106. The adhesive is disposed between, and bonds together, first and second header segments 102,104. Preferably, the adhesive 106 is thermally conductive and electrically insulative. It will be appreciated, however, that alternative embodiments (not shown) wherein the first and second header segments 102,104 of the composite header assembly 100 are co-bonded (i.e., bonded together, without requiring a separate intermediate adhesive), are also contemplated by the disclosed concept.

In order to still further enhance heat transfer and thereby manage (e.g., without limitation, dissipate) heat within the power distribution assembly 2, the first and second materials of the first and second header segments 102,104 are preferably both thermally conductive. Furthermore, the example first and second header segments 102,104 are first and second elongated generally planar members to provide increased thermally conductive surface area. The aforementioned fan 50 may be employed to still further help manage heat within the power distribution assembly 2.

As shown in the example of FIG. 2, at least some of the bus bars 12,14 preferably directly contact the composite header assembly 100, thereby providing a direct thermal pathway between the bus bars 12,14 and the composite header assembly 100 and, in particular, to the enhanced thermal properties (e.g., thermal conductivity; heat transfer) and increased surface area thereof. Similarly, at least some of the power inputs 16 and power outputs 18 are preferably directly connected to the composite header assembly 100, as shown in FIG. 1. In this manner, among other advantages, the composite header assembly 100 also enables various otherwise required components to be eliminated. For example and without limitation, separate ceramic insulators, which are typically required to suitably electrically insulate such inputs 16 and outputs 18, for example, are not required in view of the enhanced electrically insulating and thermally conductive properties of the composite header assembly 100, in accordance with the disclosed concept.

Continuing to refer to FIGS. 1-4, it will be appreciated that the composite header assembly 100 shown and described herein includes first and second opposing sides 110,112. The first material of the first header segment 102 is disposed on the first side 110, and the second material of the second header segment 104 is disposed on the second side 112 (best shown in FIGS. 2 and 4). The aforementioned bus bars 12,14 are substantially disposed on the second side 112, and the power inputs 16 and power outputs 18 are substantially disposed on the first side 110.

As shown in FIG. 2, at least some of the bus bars 12,14 may be at least partially imbedded in the mounting portion 10. As previously discussed, the power distribution assembly 2 may include any known or suitable number, type and/or configuration of electrical apparatus, such as the fan 50 and motors 52,54, shown. Each such electrical apparatus (e.g., without limitation, fan 50) is preferably electrically connected to a corresponding one of the inputs 16 or outputs 18 by a corresponding one of the bus bars 12,14.

Accordingly, the disclosed composite header assembly 100 provides a relatively small, lightweight and simplified mechanism utilizing enhanced electrically insulative and thermally conductive material properties to effectively manage heat transfer in a power distribution assembly 2.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A header assembly for a power distribution assembly, said power distribution assembly comprising a mounting portion and a plurality of current carrying components, said header assembly comprising:
   a first header segment made from a first material; and
   a second header segment disposed on the first header segment and being made from a second different material, said first header segment and said second header segment together forming a composite header assembly structured to be mechanically coupled to said mounting portion and electrically connected to at least some of said current carrying components,
   wherein at least one of the first material and the second material is thermally conductive and electrically insulative,
   wherein said composite header assembly further comprises an adhesive, wherein said adhesive bonds said second header segment to said first header segment; and wherein the first material of said first header segment is a thermoplastic and the second material of said second header segment is a liquid crystalline polymer.

2. The header assembly of claim 1 wherein the first material of said first header segment and the second material of said second header segment are both thermally conductive; wherein said first header segment is a first elongated generally planar member; and wherein said second header segment is a second elongated generally planar member.

3. The header assembly of claim 2 wherein said plurality of current carrying components comprises a plurality of bus bars; and wherein at least some of said bus bars directly contact said composite header assembly, thereby providing a direct thermal pathway between said bus bars and said composite header assembly.

4. The header assembly of claim 3 wherein said plurality of current carrying components further comprises a number of power inputs and a number of power outputs; and wherein at least some of said power inputs and said power outputs are structured to be directly connected to said composite header assembly, without requiring separate insulators.

5. The header assembly of claim 4 wherein said composite header assembly includes a first side and a second side disposed opposite the first side; wherein the first material is disposed on the first side; wherein the second material is disposed on the second side; wherein said power inputs and said power outputs are substantially disposed on the first side; and wherein said bus bars are substantially disposed on the second side.

6. The header assembly of claim 5 wherein at least some of said bus bars are at least partially embedded in said mounting portion; wherein said power distribution assembly further comprises a number of electrical apparatus; and wherein said electrical apparatus is electrically connected to a corresponding one of said power inputs and said power outputs by a corresponding one of said bus bars.

7. The header assembly of claim 1 wherein said adhesive is thermally conductive and electrically insulative.

8. A power distribution assembly comprising:
   a housing;
   a mounting portion coupled to said housing;
   a plurality of current carrying components, wherein said plurality of current carrying components comprises a plurality of bus bars, a number of power inputs, and a number of power outputs; and
   a composite header assembly coupled to said mounting portion, said composite header assembly comprising:
      a first header segment made from a first material, and
      a second header segment disposed on the first header segment and being made from a second different material,
      wherein said composite header assembly is electrically connected to at least some of said current carrying components,
      wherein at least one of the first material and the second material is thermally conductive and electrically insulative to electrically insulate said at least some of said current carrying components and to manage heat within said power distribution assembly,
   wherein at least some of said bus bars directly contact said composite header assembly, thereby providing a direct thermal pathway between said bus bars and said composite header assembly,
   wherein at least some of said power inputs and said power outputs are directly connected to said composite header assembly, without requiring separate insulators,
   wherein said composite header assembly includes a first side and a second side disposed opposite the first side; wherein the first material is disposed on the first side; wherein the second material is disposed on the second side; wherein said power inputs and said power outputs are substantially disposed on the first side; and wherein said bus bars are substantially disposed on the second side.

9. The power distribution assembly of claim 8 wherein the first material of said first header segment and the second material of said second header segment are both thermally conductive; wherein said first header segment is a first elongated generally planar member; and wherein said second header segment is a second elongated generally planar member.

10. The power distribution assembly of claim 8 wherein at least some of said bus bars are at least partially embedded in said mounting portion; said power distribution assembly further comprises a number of electrical apparatus; and wherein said electrical apparatus is electrically connected to a corresponding one of said power inputs and said power outputs by a corresponding one of said bus bars.

11. The power distribution assembly of claim 10 wherein said number of electrical apparatus includes a fan.

12. The power distribution assembly of claim 8 wherein the first material of said first header segment is a thermoplastic.

13. The power distribution assembly of claim 12 wherein the second material of said second header segment is a liquid crystalline polymer.

14. The power distribution assembly of claim 8 wherein said composite header assembly further comprises a thermally conductive and electrically insulative adhesive; and wherein said adhesive bonds said second header segment to said first header segment.

* * * * *